United States Patent
Shiba

(10) Patent No.: US 7,876,563 B2
(45) Date of Patent: Jan. 25, 2011

(54) COOLING STRUCTURE OF POWER SEMICONDUCTOR DEVICE AND INVERTER

(75) Inventor: Kenjiro Shiba, Toyota (JP)

(73) Assignee: Toyota Jidosha Kabushiki Kaisha, Aichi-ken (JP)

(*) Notice: Subject to any disclaimer, the term of this patent is extended or adjusted under 35 U.S.C. 154(b) by 319 days.

(21) Appl. No.: 12/161,427

(22) PCT Filed: Jan. 30, 2007

(86) PCT No.: PCT/JP2007/051885

§ 371 (c)(1),
(2), (4) Date: Jul. 18, 2008

(87) PCT Pub. No.: WO2007/089011

PCT Pub. Date: Aug. 9, 2007

(65) Prior Publication Data

US 2010/0238629 A1    Sep. 23, 2010

(30) Foreign Application Priority Data

Jan. 31, 2006    (JP) .............................. 2006-023298

(51) Int. Cl.
*H05K 7/20* (2006.01)
*H01L 23/34* (2006.01)
*F28F 7/00* (2006.01)

(52) U.S. Cl. ................. 361/699; 174/15.1; 257/714; 257/715; 165/80.4; 165/80.5; 165/104.33; 363/141

(58) Field of Classification Search ......... 361/698–700; 174/15.1; 257/714–715; 165/80.4–80.5; 165/104.33; 363/141

See application file for complete search history.

(56) References Cited

U.S. PATENT DOCUMENTS

| 4,765,397 | A | 8/1988 | Chrysler et al. |
| 4,884,168 | A | 11/1989 | August et al. |
| 6,141,219 | A * | 10/2000 | Downing et al. ............ 361/704 |
| 6,594,149 | B2 * | 7/2003 | Yamada et al. .............. 361/699 |
| 6,648,062 | B2 * | 11/2003 | Fukazu et al. .............. 165/80.3 |
| 7,042,725 | B2 * | 5/2006 | Martin et al. ............... 361/699 |

(Continued)

FOREIGN PATENT DOCUMENTS

JP    2002-046482 A    2/2002

(Continued)

*Primary Examiner*—Zachary M Pape
(74) *Attorney, Agent, or Firm*—Sughrue Mion, PLLC

(57) ABSTRACT

A cooling structure of a power semiconductor device includes a cooling water passage and a plurality of fins. The cooling water for cooling the power semiconductor device flows through the cooling water passage. The plurality of fins are provided on a path of the cooling water passage and set up with a spacing therebetween in a direction orthogonal to a flow direction of the cooling water. The plurality of fins promote heat exchange between the power semiconductor device and the cooling water. The plurality of fins have ends facing the upstream side of a cooling water flow. The end of at least one fin among the plurality of fins is arranged so as to be displaced to a more upstream side of the cooling water flow than the ends of the fins adjacent to both sides of the at least one fin. By such a configuration, there is provided a cooling structure of a power semiconductor device and an inverter with excellent cooling efficiency.

8 Claims, 5 Drawing Sheets

U.S. PATENT DOCUMENTS

| | | | |
|---|---|---|---|
| 7,090,044 B2 * | 8/2006 | Nakamura et al. | 180/65.8 |
| 2002/0011327 A1 | 1/2002 | Fukazu et al. | |
| 2007/0045801 A1 * | 3/2007 | Sugiyama et al. | 257/684 |

FOREIGN PATENT DOCUMENTS

| | | |
|---|---|---|
| JP | 2002-185175 A | 6/2002 |
| JP | 2002-368470 A | 12/2002 |
| JP | 2003-023281 A | 1/2003 |
| JP | 2003-258169 A | 9/2003 |
| JP | 2004-349324 A | 12/2004 |
| JP | 2005-079337 A | 3/2005 |

* cited by examiner

COOLING STRUCTURE OF POWER SEMICONDUCTOR DEVICE AND INVERTER

CROSS REFERENCE TO RELATED APPLICATION

This application is a National Stage of International Application No. PCT/JP2007/051885 filed on Jan. 30, 2007, claiming priority based on Japanese Patent Application No. 2006-023298, filed Jan. 31, 2006, the contents of all of which are incorporated herein by reference in their entirety.

TECHNICAL FIELD

The present invention generally relates to a cooling structure of a power semiconductor device and an inverter, and more particularly to a water-cooled cooling structure of a power semiconductor device and an inverter to which the cooling structure is applied.

BACKGROUND ART

With reference to a conventional cooling structure of a power semiconductor device, for example, Japanese Patent Laying-Open No. 2004-349324 (Patent Document 1) discloses a direct water-cooled power semiconductor module structure which is aimed at achieving a high heat transfer coefficient and improving the cooling efficiency. According to Patent Document 1, stripe-shaped cooling fins are formed on a surface opposite to a surface where a power semiconductor device is mounted.

Japanese Patent Laying-Open No. 2002-368470 (Patent Document 2) discloses a cooling apparatus of a heat generating body which is aimed at cooling the heat generating body sufficiently and to an approximately uniform temperature. Furthermore, Japanese Patent Laying-Open No. 2003-23281 (Patent Document 3) discloses a cooling apparatus which is aimed at increasing the discharged air volume by an electric fan to cool a heat generating body such as a semiconductor package efficiently and effectively. The cooling apparatuses disclosed in Patent Documents 2 and 3 are air-cooled type.

Japanese Patent Laying-Open No. 2002-46482 (Patent Document 4) discloses a heat sink-type cooling apparatus which is aimed at enhancing the heat radiating effect of fins without upsizing them. The heat sink-type cooling apparatus disclosed in Patent Document 4 has a passage through which a coolant flows. Within the passage, a fin group is placed having a plurality of fins arranged in parallel to a flow direction of the coolant and aligned in a direction of the thickness of the fins. The fins of fin groups adjacent to each other in the flow direction of the coolant are arranged so as to be displaced from each other in the direction of the thickness of the fins.

In the cooling structures disclosed in the above-described Patent Documents, a plurality of fins are set up with a spacing therebetween in order to improve the cooling efficiency. The fins are, however, arranged on a path along which a cooling medium flows. Therefore, in a case where the cooling water is used as the cooling medium, the fins and the cooling water flowing through the cooling water passage collide with each other. In this case, when all of the fins collide with the cooling water at the same position in the flow direction of the cooling water, a collision reaction force increases and a vortex flow is generated in the cooling water flow. As a result, a pressure loss of the cooling water flow may significantly increase and the power semiconductor device may not be able to be efficiently cooled.

DISCLOSURE OF THE INVENTION

In order to solve the above-described problems, an object of the present invention is to provide a cooling structure of a power semiconductor device and an inverter with excellent cooling efficiency.

A cooling structure of a power semiconductor device according to the present invention includes a cooling water passage and a plurality of fins. The cooling water passage is formed opposite to a mounting surface where the power semiconductor device is mounted. A cooling water for cooling the power semiconductor device flows through the cooling water passage. The plurality of fins are provided on a path of the cooling water passage and set up with a spacing therebetween in a direction orthogonal to a flow direction of the cooling water. The plurality of fins promote heat exchange between the power semiconductor device and the cooling water. The plurality of fins have ends facing an upstream side of a cooling water flow. The end of at least one fin among the plurality of fins is arranged so as to be displaced to a more upstream side of the cooling water flow than the ends of the fins adjacent to both sides of the at least one fin.

According to the cooling structure of the power semiconductor device configured in the above-described manner, respective positions where the cooling water flowing through the cooling water passage collides with the ends of the fins can be displaced between the fin having the end arranged on the upstream side and the fins adjacent to both sides of the fin in the flow direction of the cooling water. Furthermore, when the cooling water collides with the ends of the fins and the cooling water flow in the direction different from the flow direction along the cooling water passage is generated, the generated cooling water flow can be divided by the fin having the end arranged on the upstream side. Therefore, the formation of a vortex flow in the cooling water flow can be suppressed. As a result, the increase in a pressure loss of the cooling water flow can be reduced and the cooling efficiency of the power semiconductor device can be improved.

Preferably, the ends are arranged such that respective positions where the cooling water flowing through the cooling water passage and the ends collide with each other are displaced between the plurality of fins in the flow direction of the cooling water. A pressure loss of the cooling water flow generated due to the collision between the cooling water and the ends is reduced. According to the cooling structure of the power semiconductor device configured in the above-described manner, positions where the pressure loss is generated are distributed in the flow direction of the cooling water. As a result, the pressure loss of the cooling water flow can be reduced and the smooth cooling water flow can be realized.

The cooling water passage is provided with a blocking member that blocks the cooling water flow in a part of a cross section of the cooling water passage. Preferably, the ends are arranged adjacently to the blocking member on a more downstream side of the cooling water flow than the blocking member. According to the cooling structure of the power semiconductor device configured in the above-described manner, the cooling water flow stagnates on the downstream side of the blocking member. Therefore, when the cooling water collides with the ends of the fins and the cooling water flow in the direction different from the flow direction along the cooling water passage is generated, a vortex flow is likely to be generated. Thus, by displacing the end of each fin arranged at that position in the flow direction of the cooling water, the increase in a pressure loss of the cooling water flow can be effectively suppressed.

The cooling water passage is formed at a position between a pair of inner walls that are arranged on both sides of the plurality of fins and face each other. Preferably, the ends are arranged so as to be displaced from a downstream side to the upstream side of the cooling water flow as a distance from each of the pair of inner walls increases. According to the cooling structure of the power semiconductor device configured in the above-described manner, when the cooling water collides with the ends of the fins and the cooling water flow in the direction different from the flow direction along the cooling water passage is generated, the generated cooling water flow can be divided into one side and the other side of the pair of inner walls by the fin having the end arranged on the most upstream side. As a result, the generation of a vortex flow can be suppressed and the increase in a pressure loss of the cooling water flow can be effectively reduced.

Preferably, the ends are arranged so as to be alternately displaced to the upstream side and a downstream side of the cooling water flow in the direction in which the plurality of fins are lined up. According to the cooling structure of the power semiconductor device configured in the above-described manner, when the cooling water collides with the ends of the fins and the cooling water flow in the direction different from the flow direction along the cooling water passage is generated, the generated cooling water flow can be divided by each fin having the end arranged on the upstream side. As a result, the generation of a vortex flow can be suppressed and the increase in a pressure loss of the cooling water flow can be effectively reduced.

Preferably, the ends that are arranged so as to be displaced to the upstream side of the cooling water flow are displaced in the flow direction of the cooling water, and the ends that are arranged so as to be displaced to the downstream side of the cooling water flow are displaced in the flow direction of the cooling water. According to the cooling structure of the power semiconductor device configured in the above-described manner, respective positions where the ends and the cooling water collide with each other can be displaced between the ends that are arranged so as to be displaced to the upstream side of the cooling water flow and between the ends that are arranged so as to be displaced to the downstream side of the cooling water flow, respectively. As a result, the increase in a pressure loss of the cooling water flow can further effectively be suppressed.

The cooling water passage is formed at a position between a pair of inner walls that are arranged on both sides of the plurality of fins and face each other. The cooling water passage meanders on the mounting surface. Preferably, at a straight portion of the cooling water passage extending straight, the ends are arranged so as to be displaced from a downstream side to the upstream side of the cooling water flow as a distance from each of the pair of inner walls increases.

The cooling water passage meanders on the mounting surface. Preferably, at a curved portion of the cooling water passage extending in a curve, the ends are arranged so as to be displaced from the upstream side to a downstream side of the cooling water flow toward the direction from an inner circumferential side to an outer circumferential side of the curved portion.

The cooling water passage is formed at a position between a pair of inner walls that are arranged on both sides of the plurality of fins and face each other. The cooling water passage meanders on the mounting surface. Preferably, at a straight portion of the cooling water passage extending straight, the ends are arranged so as to be displaced from a downstream side to the upstream side of the cooling water flow as a distance from each of the pair of inner walls increases. At a curved portion of the cooling water passage extending in a curve, the ends are arranged so as to be displaced from the upstream side to a downstream side of the cooling water flow toward the direction from an inner circumferential side to an outer circumferential side of the curved portion.

An inverter according to the present invention has the cooling structure of the above-described power semiconductor device applied thereto, and is mounted on a vehicle. According to the inverter configured in the above-described manner, the inverter can be downsized as a result of improving the cooling efficiency of the inverter. Furthermore, the electric power consumed for cooling the inverter can be reduced and the fuel efficiency of the vehicle can be improved.

As described above, according to the present invention, there can be provided a cooling structure of a power semiconductor device and an inverter with excellent cooling efficiency.

BEST MODES FOR CARRYING OUT THE INVENTION

Figure 1:
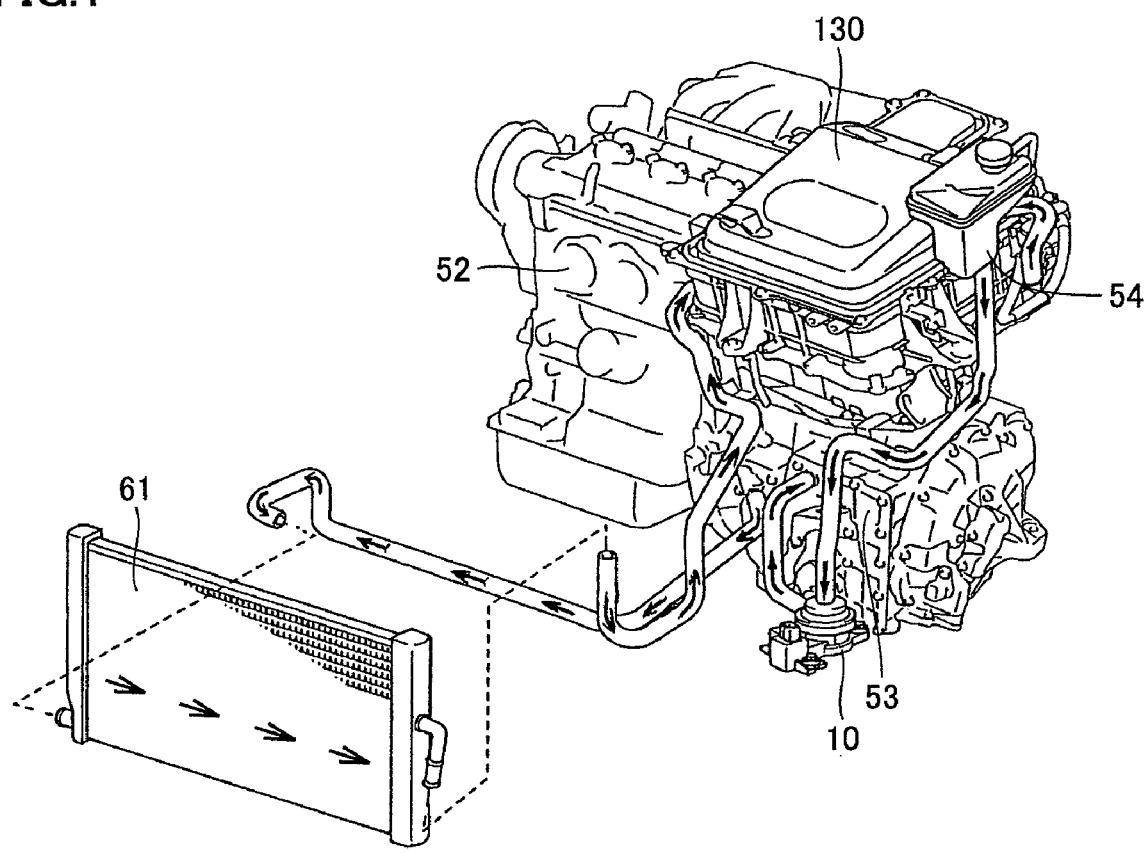
FIG. 1 is a perspective view of a cooling system of an HV system.

The embodiments of the present invention will be described with reference to the drawings. The same or corresponding components are represented by the same reference numbers in the drawings referenced below.

FIG. 1 is a perspective view of a cooling system of an HV (Hybrid Vehicle) system. The cooling system of the HV system shown in FIG. 1 is mounted on a hybrid vehicle powered by a motor and an internal combustion engine such as a gasoline engine or a diesel engine.

Referring to FIG. 1, the hybrid vehicle includes an engine 52, a transaxle 53 equipped with a motor for driving and a generator for generating electric power (referred to as a motor generator hereinafter), an inverter 130 making conversion between the DC (Direct Current) voltage of a battery and the AC (Alternating Current) voltage of the motor generator, and a radiator 61.

Radiator 61 is provided with two cooling water channels that are independent of each other. One cooling water channel forms a cooling system of engine 52, and the other forms the cooling system of the HV system. The cooling system of the HV system is, for example, formed by the cooling water channel that follows in turn from radiator 61 through inverter 130, a reservoir tank 54, a water pump 10, and transaxle 53 to radiator 61. The cooling water (for example, an ethylene glycol-based coolant) within the channel is forced to circulate by water pump 10 to cool inverter 130 and the motor generator provided to transaxle 53 in turn. The temperature of the cooling water having increased due to cooling is reduced while the cooling water flows through radiator 61.

Figure 2:
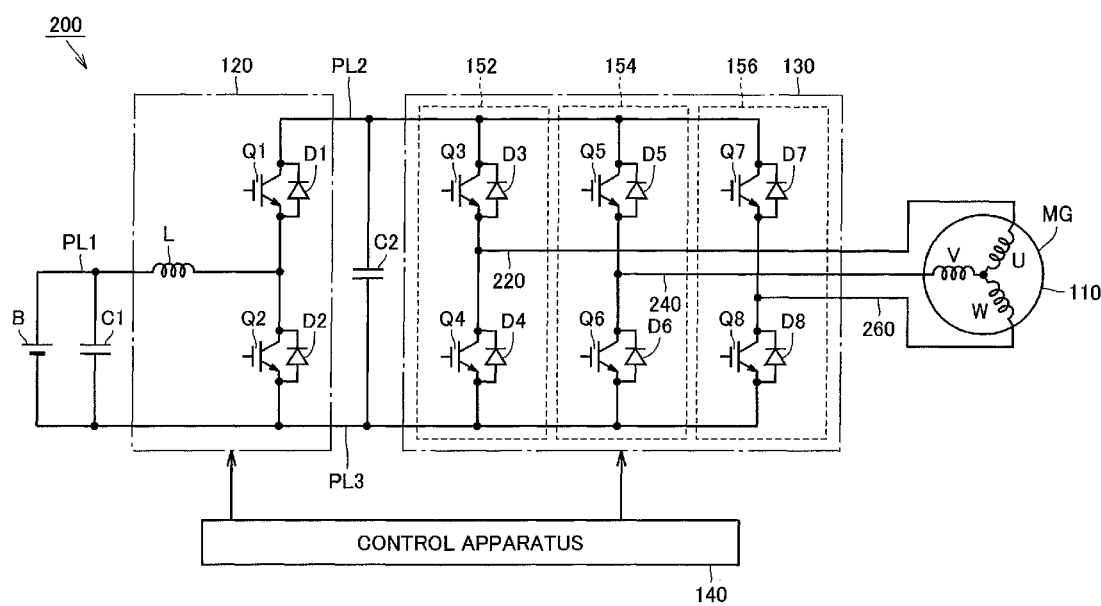
FIG. 2 is an electrical circuit diagram of a main portion of an HV system.

FIG. 2 is an electrical circuit diagram of a main portion of an HV system. Referring to FIG. 2, an HV system 200 includes a converter 120, a control apparatus 140, capacitors C1 and C2, power supply lines PL1-PL3, and output lines 220, 240 and 260, in addition to a motor generator 110 and inverter 130. Although motor generator 110 in practice includes a motor generator MG1 that functions mainly as a generator and a motor generator MG2 that functions mainly as a motor, it is illustrated as one motor generator for the sake of simplifying the following description.

Converter 120 is connected to a battery B via power supply lines PL1 and PL3. Inverter 130 is connected to converter 120 via power supply lines PL2 and PL3. Inverter 130 is connected to motor generator 110 via output lines 220, 240 and 260. Battery B is a DC power supply and is formed of a secondary battery, for example, a nickel metal hydride battery, lithium-ion battery or the like. Battery B supplies the stored DC power to converter 120 and is charged by the DC power received from converter 120.

Motor generator 110 is, for example, a three-phase AC synchronous electric motor generator and generates a driving force by means of the AC power received from inverter 130. Motor generator 110 is also used as a generator. Motor generator 110 generates the AC power by the action of electric power generation at the time of deceleration (regenerative electric power generation) to supply the generated AC power to inverter 130.

Converter 120 includes upper and lower arms formed of semiconductor modules, and a reactor L. The upper and lower arms are connected in series between power supply lines PL2 and PL3. The upper arm connected to power supply line PL2 is made up of a power transistor (IGBT: Insulated Gate Bipolar Transistor) Q1 and a diode D1 connected in antiparallel to power transistor Q1. The lower arm connected to power supply line PL3 is made up of a power transistor Q2 and a diode D2 connected in antiparallel to power transistor Q2. Reactor L is connected between power supply line PL1 and a connection point of the upper and lower arms.

Converter 120 boosts the DC voltage received from battery B by means of reactor L to supply the boosted voltage to power supply line PL2. Converter 120 steps down the DC voltage received from inverter 130 to charge battery B. It should be noted that converter 120 does not necessarily need to be provided.

Inverter 130 includes an U-phase arm 152, a V-phase arm 154 and a W-phase arm 156. U-phase arm 152, V-phase arm 154 and W-phase arm 156 are connected in parallel between power supply lines PL2 and PL3. Each of U-phase arm 152, V-phase arm 154 and W-phase arm 156 is made up of upper and lower arms formed of semiconductor modules. The upper and lower arms of each phase arm are connected in series between power supply lines PL2 and PL3.

The upper arm of U-phase arm 152 is made up of a power transistor (IGBT) Q3 and a diode D3 connected in antiparallel to power transistor Q3. The lower arm of U-phase arm 152 is made up of a power transistor Q4 and a diode D4 connected in antiparallel to power transistor Q4. The upper arm of V-phase arm 154 is made up of a power transistor Q5 and a diode D5 connected in antiparallel to power transistor Q5. The lower arm of V-phase arm 154 is made up of a power transistor Q6 and a diode D6 connected in antiparallel to power transistor Q6. The upper arm of W-phase arm 156 is made up of a power transistor Q7 and a diode D7 connected in antiparallel to power transistor Q7. The lower arm of W-phase arm 56 is made up of a power transistor Q8 and a diode D8 connected in antiparallel to power transistor Q8. The connection point of the power transistors of each phase arm is connected to the antineutral point side of the corresponding phase coil of motor generator 110 via the corresponding output line.

Although the figure shows that each arm of U-phase arm 152 to W-phase arm 156 is formed of one semiconductor module made up of a power transistor and a diode, it may be formed of a plurality of semiconductor modules.

Based on a control signal from control apparatus 140, inverter 130 converts the DC voltage received from power supply line PL2 into the AC voltage to output the converted voltage to motor generator 110. Inverter 130 rectifies the AC voltage generated by motor generator 110 to the DC voltage to supply the rectified voltage to power supply line PL2.

Capacitor C1 is connected between power supply lines PL1 and PL3 to smooth the voltage level of power supply line PL1. Capacitor C2 is connected between power supply lines PL2 and PL3 to smooth the voltage level of power supply line PL2.

Control apparatus 140 calculates a coil voltage of each phase of motor generator 110 based on a torque command value and a current value of each phase of motor generator 110 as well as an input voltage of inverter 130. Based on the result of the calculation, control apparatus 140 generates a PWM signal by which power transistors Q3-Q8 are turned ON/OH, to output the generated PWM signal to inverter 130. A current value of each phase of motor generator 110 is detected by a current sensor incorporated in the semiconductor module forming each arm. This current sensor is placed within the semiconductor module so that the S/N ratio is improved. Control apparatus 140 calculates the duty ratio of power transistors Q1 and Q2 for optimizing the input voltage of inverter 130, based on the above-described torque command value and the number of revolutions of the motor. Based on the result of the calculation, control apparatus 140 generates a PWM signal by which power transistors Q1 and Q2 are turned ON/OFF to output the generated PWM signal to converter 120.

Furthermore, control apparatus 140 controls the switching operation of power transistors Q1-Q8 in converter 120 and inverter 130 in order to convert the AC voltage generated by motor generator 110 to the DC voltage to charge battery B.

Figure 3:
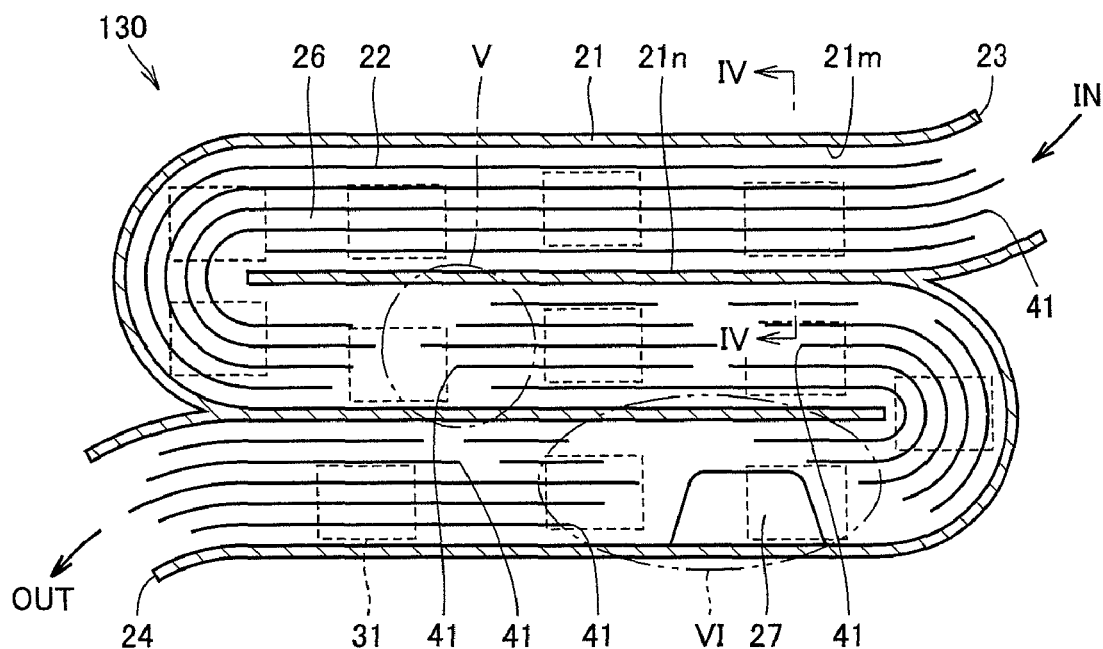
FIG. 3 is a plan view of a cooling structure of the inverter shown in FIG. 1.
Figure 4:
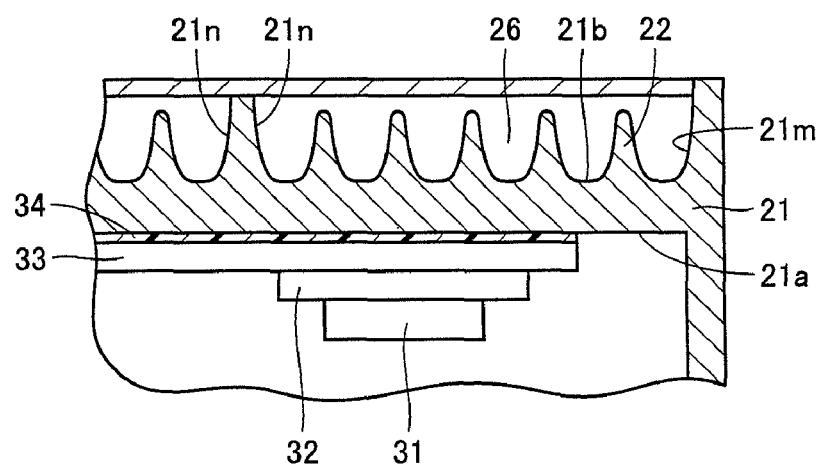
FIG. 4 is a cross sectional view of the inverter taken along the line IV-IV in FIG. 3.

The description of a cooling structure of inverter 130 will follow. In the present embodiment, a cooling structure of a power semiconductor device according to the present invention is applied to inverter 130. FIG. 3 is a plan view of a cooling structure of the inverter shown in FIG. 1. FIG. 4 is a cross sectional view of the inverter taken along the line IV-IV in FIG. 3.

Referring to FIGS. 3 and 4, inverter 130 includes a case body 21 having a mounting surface 21a and a surface 21b facing opposite to mounting surface 21a. Case body 21 is formed by aluminum die casting. Case body 21 is not, however, limited to being formed thereby. It may be formed of, for example, iron or magnesium.

A heat radiating plate 33 is fixed to mounting surface 21a with silicon grease 34 interposed therebetween. Furthermore, on heat radiating plate 33, a plurality of chips 31 are fixed with insulating substrates 32 interposed therebetween. For example, silicon grease 34 and heat radiating plate 33 may not be provided and insulating substrates 32 may be directly fixed to mounting surface 21a. The plurality of chips 31 are provided at positions spaced apart from one another on mounting surface 21a. Chips 31 are provided corresponding to each arm of U-phase arm 152 to W-phase arm 156 and include semiconductor modules made up of power transistors and diodes. It should be noted that FIG. 3 shows twelve chips 31, two of which constitute each arm.

A cooling water passage 26 is formed on surface 21b. The cooling water for cooling chips 31 flows through cooling water passage 26. Cooling water passage 26 is formed opposite to mounting surface 21a where chips 31 are mounted. Cooling water passage 26 has an inlet 23 through which the cooling water is supplied and an outlet 24 through which the cooling water is discharged. Cooling water passage 26 extends between inlet 23 and outlet 24. Cooling water passage 26 extends in parallel to mounting surface 21a. Cooling water passage 26 meanders on surface 21b. Cooling water passage 26 extends in such a manner that it overlaps the positions where chips 31 are mounted as mounting surface 21a is seen in a plan view. Case body 21 has inner walls 21m and 21n facing each other with a spacing therebetween and defining cooling water passage 26.

The cooling water supplied through inlet 23 to cooling water passage 26 flows along a path of cooling water passage 26. While flowing, the cooling water cools chips 31 by the heat exchange with chips 31 through case body 21. The cooling water having an increased temperature as a result of the heat exchange with chips 31 is discharged from cooling water passage 26 through outlet 24.

Cooling water passage 26 is provided with fins 22. Fins 22 promotes the heat exchange through case body 21 between chips 31 and the cooling water flowing though cooling water passage 26. Fins 22 project from surface 21b. Fins 22 have a surface that contacts the cooling water. Fins 22 are integrally formed with case body 21. Fins 22 are not limited thereto. They may be provided at a separate body and fixed to case body 21. The surface of fins 22 may have a minute concave-convex shape. Fins 22 may have any cross-sectional shapes such as a chevron, a rectangle or a triangle as fins 22 are cut in a plane orthogonal to the flow direction of the cooling water.

A plurality of fins 22 are formed with a spacing therebetween in the direction orthogonal to the direction in which cooling water passage 26 extends, that is, in the direction orthogonal to the flow direction of the cooling water. Fins 22 extend along the direction in which cooling water passage 26 extends. The plurality of fins 22 are arranged at regular intervals. The plurality of fins 22 may be arranged at different intervals. Fins 22 may extend in a wavy manner along the direction in which cooling water passage 26 extends. Fins 22 are intermittently interrupted in the direction in which they extend. Fins 22 have ends 41 facing the upstream side of the cooling water flow of cooling water passage 26.

Figure 5:
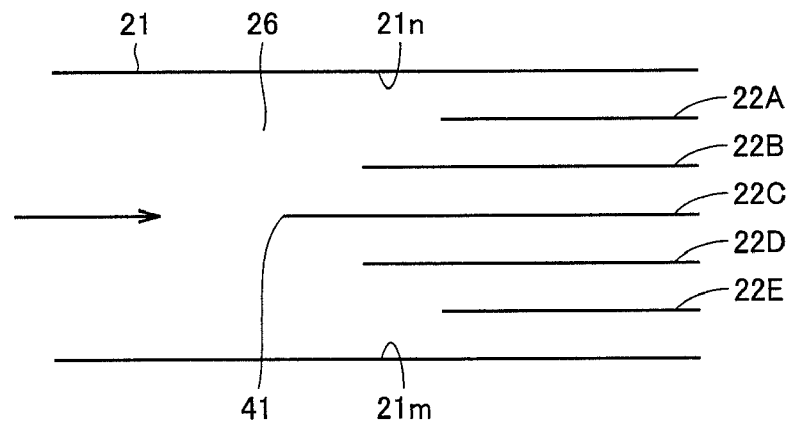
FIG. 5 is a plan view of a cooling water passage in which the portion surrounded by a two-dot chain line V in FIG. 3 is shown.

FIG. 5 is a plan view of a cooling water passage in which the portion surrounded by a two-dot chain line V in FIG. 3 is shown. An arrow in FIG. 5 shows the direction in which the cooling water flows. Referring to FIG. 5, cooling water passage 26 is provided with fins 22A, 22B, 22C, 22D, and 22E. Fins 22A-22E are lined up in the described order in the direction orthogonal to the flow direction of the cooling water. That is, fins 22A and 22E are provided adjacently to inner walls 21n and 21m respectively. Fin 22C is provided in the center of the plurality of fins 22 that are lined up in the direction orthogonal to the cooling water flow. It should be noted that cooling water passage 26 is not limited to being provided with five fins that are lined up in the direction orthogonal to the flow direction of the cooling water as shown in FIG. 5. It may be provided with any appropriate number of fins if it is provided with two or more fins. The number of fins may be even or odd.

End 41 of at least one fin 22 among the plurality of fins 22 is arranged so as to be displaced to the more upstream side of the cooling water flow than ends 41 of fins 22 adjacent to both sides of the at least one fin 22. In FIG. 5, end 41 of fin 22C is arranged so as to be displaced to the more upstream side of the cooling water flow than ends 41 of fins 22B and 22D adjacent to both sides of fin 22C. The plurality of fins 22 are provided so that at least a part of the arrangement of ends 41 has a chevron shape that is convex toward the upstream side of the cooling water flow. Ends of the plurality of fins 22 are arranged so as to be displaced in the flow direction of the cooling water at all positions where fins 22 adjoin each other.

End 41 of fin 22C is arranged on the most upstream side of the cooling water flow. End 41 of fin 22B is arranged on the more downstream side of the cooling water flow than end 41 of fin 22C, and end 41 of fin 22A is arranged on the more downstream side of the cooling water flow than end 41 of fin 22B. End 41 of fin 22D is arranged on the more downstream side of the cooling water flow than end 41 of fin 22C, and end 41 of fin 22E is arranged on the more downstream side of the cooling water flow than end 41 of fin 22D. That is, ends 41 of the plurality of fins 22 are provided so as to be displaced from the downstream side to the upstream side of the cooling water flow as the distance from inner walls 21n and 21m increases.

In a cross section of cooling water passage 26 that is cut in a plane orthogonal to the flow direction of the cooing water, the cooling water flow has an approximately uniform velocity distribution before ends 41. Ends 41 of the plurality of fins 22 are arranged at symmetrical positions with respect to an intermediate position between inner walls 21n and 21m on both sides of the intermediate position. In this case, the occurrence of a significant deviation in the velocity distribution of the cooling water on the downstream side of ends 41 can be prevented.

Although the present embodiment has been described based on a structure in which ends 41 of the plurality of fins 22 are arranged so as to be displaced at all positions where fins 22 adjoin each other, the present invention is not limited thereto. Some fins 22 adjacent to each other may have respective ends 41 identical in position in the flow direction of the cooling water.

When the cooling water collides with ends 41 of fins 22 at the same position in the flow direction of the cooling water, the reaction force generated at the time of collision increases. This may bring about the cooling water flow in the direction opposite to the flow direction of the cooling water, and therefore, a vortex flow may be generated at cooling water passage 26. When the vortex flow is generated, a pressure loss of the cooling water flow increases. As a result, the cooling performance cannot be improved. Furthermore, the deviation occurs in the velocity of the cooling water flow.

In comparison, in the present embodiment, respective positions where the cooling water collides with respective ends 41 of fins 22 are displaced from each other in the flow direction of the cooling water. This causes points where the pressure loss is generated to be distributed in the flow direction of the cooling water. Furthermore, fin 22C has end 41 arranged so as to be displaced to the most upstream side of the cooling water flow in the center of cooling water passage 26. Therefore, the cooling water having disturbed flow due to the collision with ends 41 is divided into the inner wall 21n side and the inner wall 21m side with respect to fin 22C. By such a configuration, the generation of the vortex flow in the cooling water flow can be suppressed and the increase in the pressure loss due to the collision between the cooling water and ends 41 can be reduced.

It should be noted that such structures in which ends 41 of the plurality of fins 22 are arranged so as to be displaced in the flow direction of the cooling water are provided at a plurality of points in FIG. 3 including a position where the cooling water flows through inlet 23 into cooling water passage 26.

Figure 6:
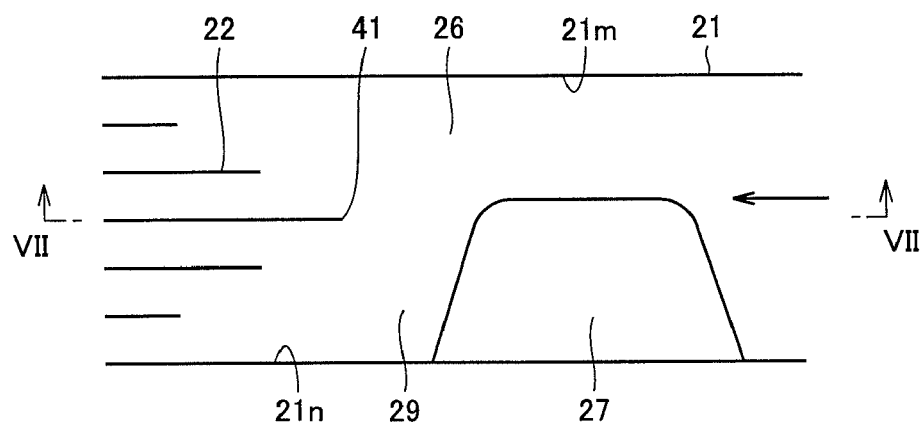
FIG. 6 is a plan view of a cooling water passage in which the portion surrounded by a two-dot chain line VI in FIG. 3 is enlarged.
Figure 7:
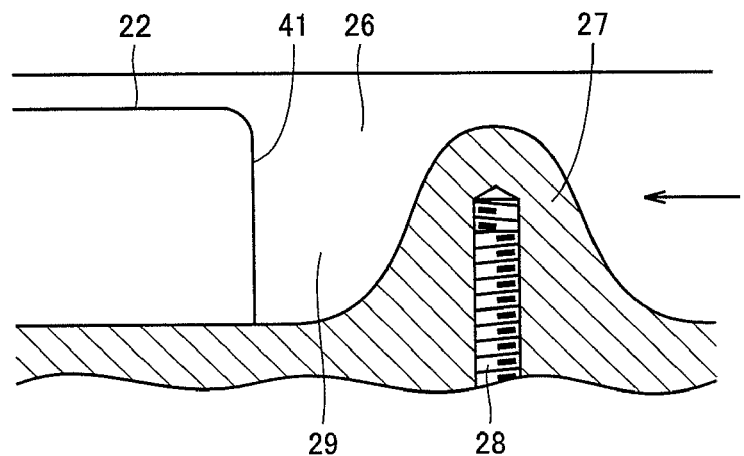
FIG. 7 is a cross sectional view of the cooling water passage taken along the line VII-VII in FIG. 6.

FIG. 6 is a plan view of a cooling water passage in which the portion surrounded by a two-dot chain line VI in FIG. 3 is enlarged. FIG. 7 is a cross sectional view of the cooling water passage taken along the line VII-VII in FIG. 6.

Referring to FIGS. 6 and 7, a protrusion 27 for inserting a bolt 28 is placed at cooling water passage 26. Protrusion 27 projects from inner wall 21n toward cooling water passage 26. Protrusion 27 is provided so that it may block the cooling water flow in a part of a cross section of cooling water passage 26. In the cross section of cooling water passage 26 where protrusion 27 is placed, the cooling water has a non-uniform velocity distribution. Ends 41 of fins 22 are arranged on the more downstream side of the cooling water flow than protrusion 27. Protrusion 27 is provided adjacently to ends 41.

In such a configuration, the cooling water flow stagnates in a space 29 between protrusion 27 and fins 22. In space 29 where the cooling water flow stagnates, the vortex flow is likely to be generated. Therefore, the increase in the pressure loss is particularly a major problem. In the present embodiment, the resistance offered by ends 41 of fins 22 is reduced to control the vortex flow. Therefore, the generation of the vortex flow can be suppressed and the pressure loss can be reduced. As a result, the above-described problems that arise when fins 22 are provided at a point where the cooling water flow stagnates can be solved.

In a case where a cross section of cooling water passage 26 that is cut in a plane orthogonal to the flow direction of the cooling water has a first region where the velocity of the cooling water flow relatively decreases, and a second region where the velocity of the cooling water flow relatively increases, it is preferable that end 41 arranged in the first region is disposed on the more downstream side of the cooling water flow than end 41 arranged in the second region. In this case, the velocity distribution of the cooling water can be kept more uniform on the downstream side of ends 41.

The cooling structure of the power semiconductor device according to the embodiment of the present invention includes cooling water passage 26 and the plurality of fins 22. Cooling water passage 26 is formed opposite to mounting surface 21a where chips 31 qualified as a power semiconductor device are mounted. The cooling water for cooling chips 31 flows through cooling water passage 26. The plurality of fins 22 are provided on the path of cooling water passage 26 and set up with a spacing therebetween in the direction orthogonal to the flow direction of the cooling water. The plurality of fins 22 promote heat exchange between chips 31 and the cooling water. The plurality of fins 22 have ends 41 facing the upstream side of the cooling water flow. End 41 of at least one fin 22 among the plurality of fins 22 is arranged so as to be displaced to the more upstream side of the cooling water flow than ends 41 of fins 22 adjacent to both sides of the at least one fin 22.

According to the cooling structure of the power semiconductor device in the embodiment of the present invention that is configured in the above-described manner, the pressure loss generated at cooling water passage 26 tends to increase because water having higher density than air is used as the cooling medium. In the present embodiment, ends 41 of the plurality of fins 22 are displaced one another in the flow direction of the cooling water. Therefore, the pressure loss can be reduced and the cooling efficiency of inverter 130 can be improved. As a result, the dynamics of a hybrid vehicle can be improved and inverter 130 can be downsized. Furthermore, the electric power consumed at water pump 10 can be reduced and the fuel efficiency of the hybrid vehicle can be improved.

Figure 8:
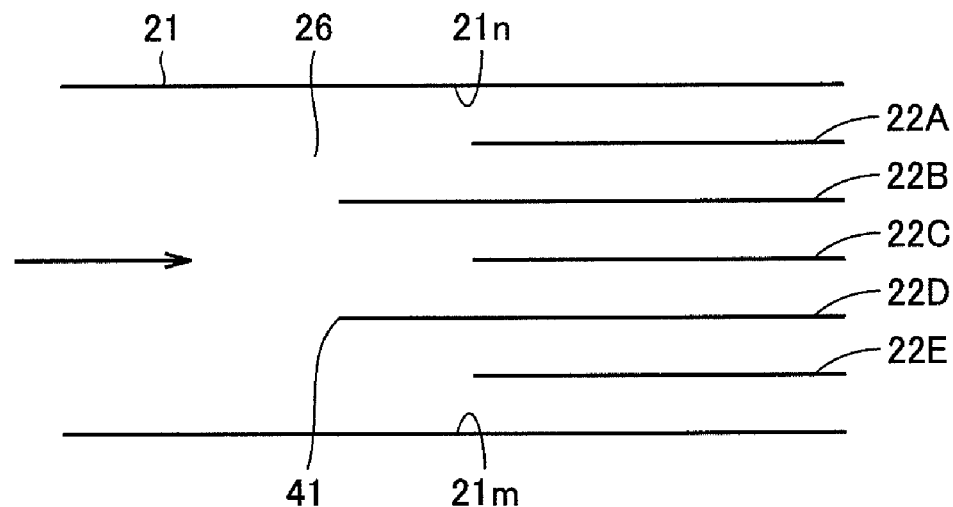
FIG. 8 is a plan view of a cooling water passage showing a modification of the shape of fins in FIG. 5.

FIG. 8 is a plan view of a cooling water passage showing a modification of the shape of fins in FIG. 5. Referring to FIG. 8, in the present modification, ends 41 of fins 22B and 22D are arranged relatively on the upstream side of the cooling water flow, and ends 41 of fins 22A, 22C and 22E are arranged relatively on the downstream side of the cooling water flow. That is, ends 41 of the plurality of fins 22 are arranged so as to be alternately displaced to the upstream side and the downstream side of the cooling water flow.

By such a configuration, fins 22B and 22D have a function to divide the cooling water having disturbed flow due to the collision with ends 41. Therefore, the generation of the vortex flow can be effectively suppressed.

Figure 9:
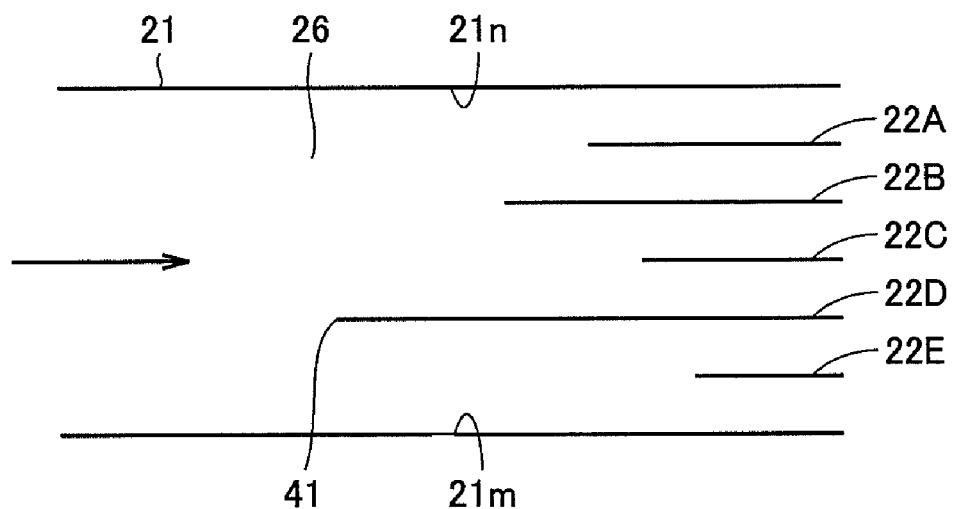
FIG. 9 is a plan view of a cooling water passage showing another modification of the shape of fins in FIG. 5.

FIG. 9 is a plan view of a cooling water passage showing another modification of the shape of fins in FIG. 5. Referring to FIG. 9, in the present modification, in addition to the configuration of the modification shown in FIG. 8, end 41 of fin 22B and end 41 of fin 22D that are arranged so as to be displaced to the upstream side of the cooling water flow are further displaced in the flow direction of the cooling water. End 41 of fin 22A, end 41 of fin 22C and end 41 of fin 22E that are arranged so as to be displaced to the downstream side of the cooling water flow are displaced in the flow direction of the cooling water.

Ends 41 of fins 22B and 22D that are arranged so as to be displaced to the upstream side of the cooling water flow are displaced from the downstream side to the upstream side of the cooling water flow toward the direction from inner wall 21n to inner wall 21m. Ends 41 of fins 22A, 22C and 22E that are arranged so as to be displaced to the downstream side of the cooling water flow are displaced from the downstream side to the upstream side of the cooling water flow toward the direction from inner wall 21m to inner wall 21n.

By such a configuration, respective positions where the cooling water collides with ends 41 of fins 22 are greatly distributed in the flow direction of the cooling water. Therefore, the generation of the vortex flow can further effectively be suppressed.

It should be understood that the embodiments disclosed herein are illustrative and not limitative in any respect. The scope of the present invention is defined by the terms of the claims, rather than the embodiments and examples above, and is intended to include any modifications within the scope and meaning equivalent to the terms of the claims.

INDUSTRIAL APPLICABILITY

The present invention is mainly applied to an inverter that is mounted on a vehicle and makes conversion between the DC voltage of a battery and the AC voltage of a motor generator.

The invention claimed is:

1. A cooling structure of a power semiconductor device, comprising:
   a cooling water passage that is formed opposite to a mounting surface where the power semiconductor device is mounted, a cooling water for cooling said power semiconductor device flowing through the cooling water passage; and a plurality of fins provided on a path of said cooling water passage and set up with a spacing therebetween in a direction orthogonal to a flow direction of the cooling water to promote heat exchange between said power semiconductor device and the cooling water, said plurality of fins having ends facing an upstream side of a cooling water flow, and said end of at least one fin among said plurality of fins being arranged so as to be displaced to a more upstream side of the cooling water flow than said ends of the fins adjacent to both sides of said fin, wherein said cooling water passage is formed at a position between a pair of inner walls that are arranged on both sides of said plurality of fins and face each other, said cooling water passage meanders on said mounting surface, and at a straight portion of said cooling water passage extending straight, said ends are arranged so as to be displaced from a downstream side to the upstream side of the cooling water flow as a distance from each of said pair of inner walls increases.

2. The cooling structure of a power semiconductor device according to claim 1, wherein said ends are arranged such that positions where the cooling water flowing through said cooling water passage and said ends collide with each other are displaced between said plurality of fins in the flow direction of the cooling water, and a pressure loss of the cooling water flow generated due to the collision between the cooling water and said ends is reduced.

3. The cooling structure of a power semiconductor device according to claim 1, wherein said cooling water passage is provided with a blocking member that blocks the cooling water flow in a part of a cross section of said cooling water passage, and said ends are arranged adjacently to said blocking member on a more downstream side of the cooling water flow than said blocking member.

4. The cooling structure of a power semiconductor device according to claim 1, wherein said ends are arranged so as to be increasingly displaced from the downstream side to the upstream side of the cooling water flow as the distance from each of said pair of inner walls increases.

5. The cooling structure of a power semiconductor device according to claim 1, further comprising additional fins, said additional fins having ends facing the upstream side of the cooling water flow, wherein said ends of said additional fins are arranged so a to be alternately displaced to the upstream side and the downstream side of the cooling water flow in the direction in which said additional fins are lined up.

6. The cooling structure of a power semiconductor device according to claim 5, wherein said ends of said additional fins that are arranged so as to be displaced to the upstream side of the cooling water flow are displaced in the flow direction of the cooling water, and said ends of said additional fins that are arranged so as to be displaced to the downstream side of the cooling water flow are displaced in the flow direction of the cooling water.

7. The cooling structure of a power semiconductor device according to claim 1, further comprising additional fins at a curved portion of said cooling water passage extending in a curve, ends of said additional fins are arranged so as to be displaced from the downstream side to the upstream side of the cooling water flow toward the direction from an inner circumferential side to an outer circumferential side of said curved portion.

8. An inverter having the cooling structure of a power semiconductor device as recited in claim 1, and mounted on a vehicle.

* * * * *